US006767427B2

(12) United States Patent
Walters et al.

(10) Patent No.: US 6,767,427 B2
(45) Date of Patent: Jul. 27, 2004

(54) APPARATUS AND METHOD FOR CONDITIONING POLISHING PAD IN A CHEMICAL MECHANICAL PLANARIZATION PROCESS

(75) Inventors: Joseph W. Walters, Orlando, FL (US); Emil Kneer, Orlando, FL (US); Eric Cooper, Orlando, FL (US); Richard Grizzard, Casselberry, FL (US)

(73) Assignee: Lam Research Corporation, Fremont, CA (US)

( * ) Notice: Subject to any disclaimer, the term of this patent is extended or adjusted under 35 U.S.C. 154(b) by 459 days.

(21) Appl. No.: 09/876,451

(22) Filed: Jun. 7, 2001

(65) Prior Publication Data

US 2002/0185223 A1 Dec. 12, 2002

(51) Int. Cl.[7] ................................................. B24B 7/00
(52) U.S. Cl. .................... 156/345.12; 451/66; 451/443
(58) Field of Search ............... 451/66, 443; 156/345.12

(56) References Cited

U.S. PATENT DOCUMENTS

| | | |
|---|---|---|
| 3,753,269 A | 8/1973 | Budman |
| 4,318,250 A | 3/1982 | Klievoneit et al. |
| 4,672,985 A | 6/1987 | Mohr |
| 4,720,939 A | 1/1988 | Simpson et al. |
| 4,934,102 A | 6/1990 | Leach et al. |
| 5,081,051 A | 1/1992 | Mattingly et al. |
| 5,335,453 A | 8/1994 | Baldy et al. |
| 5,484,323 A | 1/1996 | Smith |
| 5,531,635 A | 7/1996 | Mogi et al. |
| 5,536,202 A | 7/1996 | Appel et al. |
| 5,547,417 A | 8/1996 | Breivogel et al. |
| 5,558,568 A | 9/1996 | Talieh et al. |
| 5,575,707 A | 11/1996 | Talieh et al. |
| 5,593,344 A | 1/1997 | Weldon et al. |
| 5,611,943 A | 3/1997 | Cadien et al. |
| 5,622,526 A | 4/1997 | Phillips |
| 5,643,044 A | 7/1997 | Lund |
| 5,655,951 A | 8/1997 | Meikle et al. |
| 5,692,947 A | 12/1997 | Talieh et al. |
| 5,692,950 A | 12/1997 | Rutherford et al. |
| 5,725,417 A | 3/1998 | Robinson |
| 5,759,918 A | 6/1998 | Hoshizaki et al. |
| 5,762,536 A | 6/1998 | Pant et al. |
| 5,779,526 A | 7/1998 | Gill |
| 5,871,390 A | 2/1999 | Pant et al. |

(List continued on next page.)

FOREIGN PATENT DOCUMENTS

| | | |
|---|---|---|
| WO | WO 98/45090 | 10/1998 |
| WO | WO 99/22908 | 5/1999 |

OTHER PUBLICATIONS

S. Inaba, T. Katsuyama, M. Tanaka, "Study of CMP Polishing pad Control Method," 1998 CMP–MIC Conference, Feb. 19–20, 1998, 1998 IMIC—300P/98/0444.

(List continued on next page.)

*Primary Examiner*—P. Hassenzadel
*Assistant Examiner*—Sylvia R. MacArthur
(74) *Attorney, Agent, or Firm*—Brinks Hofer Gilson & Lione

(57) ABSTRACT

A method and apparatus for conditioning a polishing pad used in chemical mechanical planarization of semiconductor wafers is described. The apparatus includes a non-rotatable conditioning member configured to engage the polishing pad. The conditioning member includes a primary edge opposed to a secondary edge. The method includes providing a non-rotatable conditioning member configured to engage the polishing pad. The conditioning member includes a primary edge opposed to a secondary edge, wherein the primary edge and the secondary edge are both in contact with the polishing pad, and wherein the primary edge is generally parallel to the secondary edge. The method also includes moving the polishing pad in a forward direction, and pressing the conditioning member against the polishing pad.

26 Claims, 7 Drawing Sheets

U.S. PATENT DOCUMENTS

| | | | |
|---|---|---|---|
| 5,897,426 | A | 4/1999 | Somekh |
| 5,899,798 | A | 5/1999 | Trojan et al. |
| 5,908,530 | A | 6/1999 | Hoshizaki et al. |
| 5,958,794 | A | 9/1999 | Bruxvoort et al. |
| 5,975,094 | A | 11/1999 | Shurtliff |
| 6,086,460 | A | 7/2000 | Labunsky et al. |
| 6,123,607 | A | 9/2000 | Ravkin et al. |
| 6,554,688 | B2 * | 4/2003 | Lacy ............................ 451/56 |

OTHER PUBLICATIONS

MegaSonics Cleaner Products, http://www.prosysmeg.com/html/body_prod_transducer.html.

ProSys Product Systems Inc., http://ww.prosysmeg.com/body_index.html.

U.S. patent application Ser. No. 09/475,518: "Method and Apparatus for Conditioning a Polishing Pad"; Inventor: Finkelman; Filed: Dec. 30, 1999; Attorney Docket No. 7103–117.

U.S. patent application Ser. No. 09/540,385: "Method and Apparatus for Chemically–Mechanically Polishing Semiconductor Wafers"; Inventors: Travis et al.; Filed Mar. 31, 2000; Attorney Docket No. 7103–123.

U.S. patent application Ser. No. 09/540,602: "Method and Apparatus for Conditioning a Polishing Pad"; Inventor: John M. Boyd; Filed Mar. 31, 2000; Attorney Docket No. 7103–133.

U.S. patent application Ser. No. 09/540,810: "Fixed Abrasive Linear Polishing Belt and System"; Inventors: Zhao et al.; Filed Mar. 31, 2000; Attorney Docket No. 7103–135.

U.S. patent application Ser. No. 09/541,144: "Method and Apparatus for Chemical Mechanical Planarization and Polishing of Semiconductor Wafers Using a Continuous Polishing Member Feed"; Inventors: Mooring et al.; Filed Mar. 31, 2000; Attorney Docket No. 7103–165.

U.S. patent application Ser. No. 09/607,743: "A Conditioning Mechanism in a Chemical Mechanical Polishing Apparatus for Semiconductor Wafers"; Inventors: Vogtmann et al.; Filed Jun. 30, 2000; Attorney Docket No. 7103–173.

U.S. patent application Ser. No. 09/607,895: "Apparatus and Method for Conditioning a Fixed Abrasive Polishing Pad in a Chemical Mechanical Planarization Process"; Inventors: Ravkin et al.; Filed Jun. 30, 2000; Attorney Docket No. 7103–180.

U.S. Pending patent application Ser. No. 09/796,955, Entitled "Method and Apparatus for Conditioning a Polishing Pad with Sonic Energy," Filed Feb. 28, 2001; Attorney Docket No. 7103–189.

U.S. Pending patent application Ser. No. 09/754,702, Entitled "Method and Apparatus for Conditioning a Polishing Pad with Sonic Energy," Filed Jan. 4, 2001; Attorney Docket No. 7103–190.

* cited by examiner

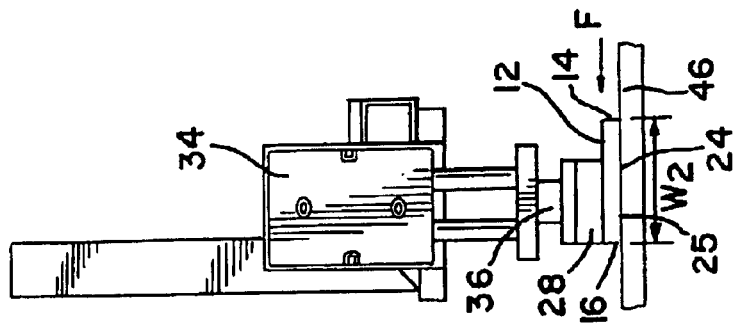
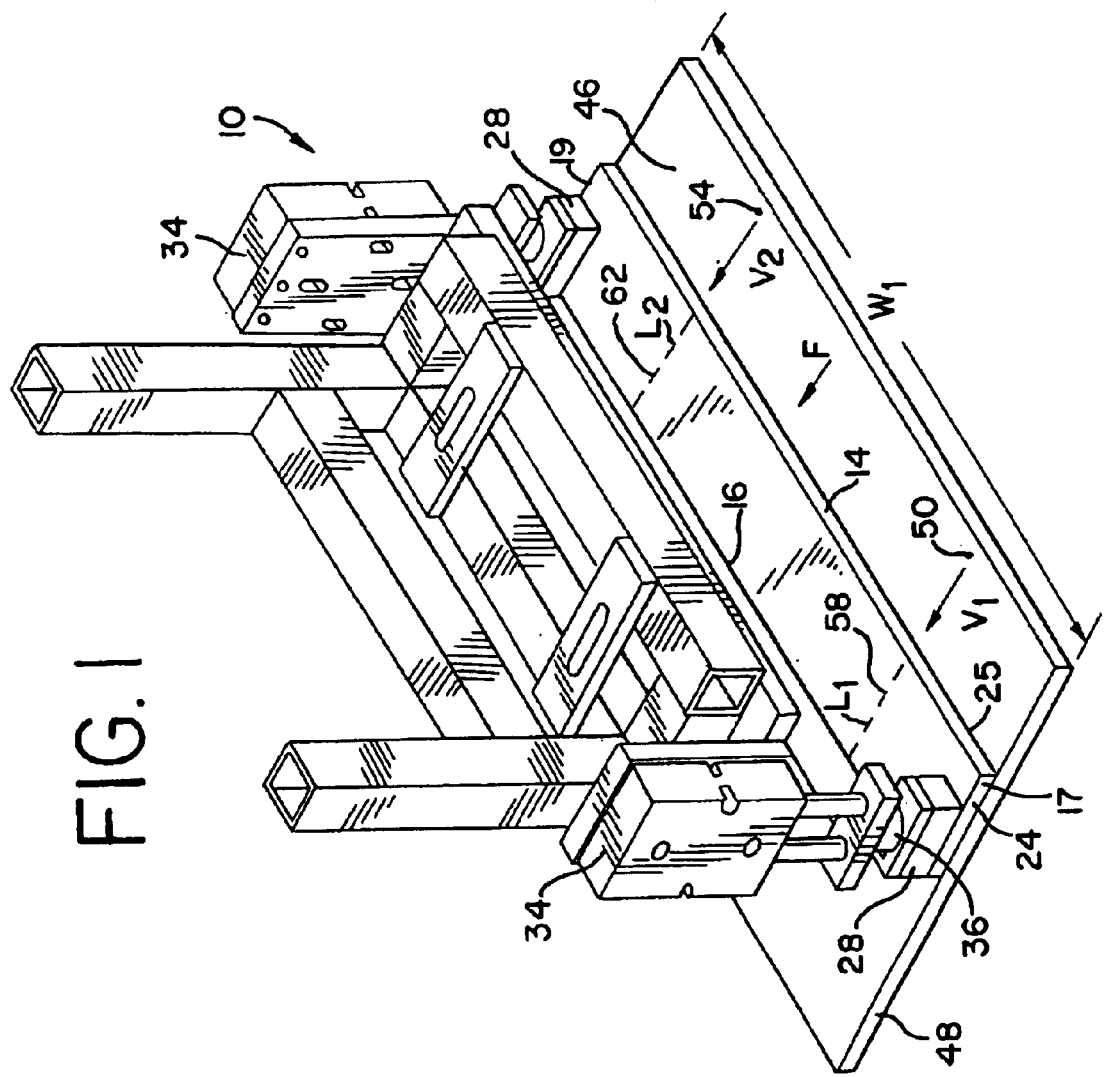

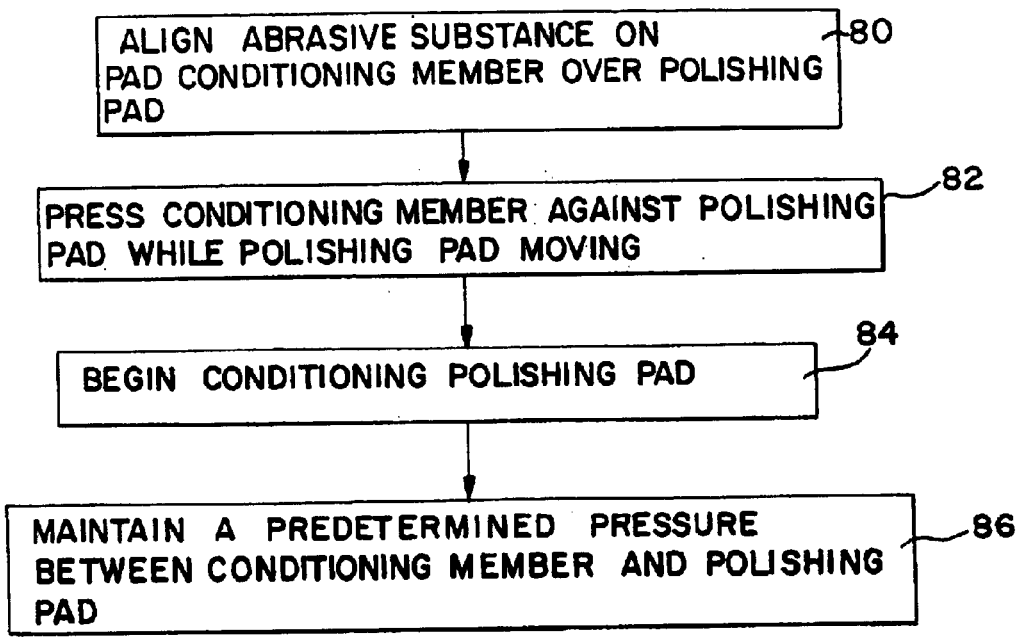
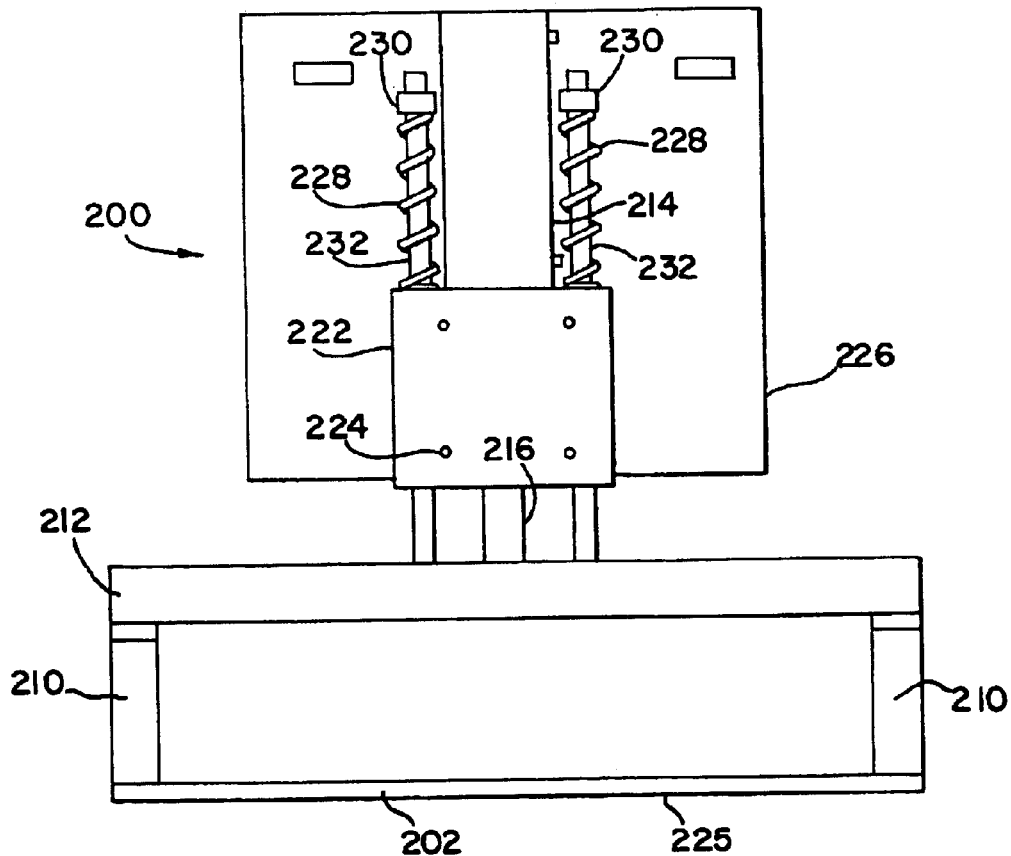

APPARATUS AND METHOD FOR CONDITIONING POLISHING PAD IN A CHEMICAL MECHANICAL PLANARIZATION PROCESS

CROSS REFERENCE TO RELATED APPLICATIONS

Related subject matter is disclosed in a commonly-owned, co-pending patent application entitled "METHOD AND APPARATUS FOR CONDITIONING A POLISHING PAD", Ser. No. 09/475,518, filed on Dec. 30, 1999, which is incorporated herein by reference; and in U.S. Pat. No. 6,086,460 entitled "METHOD AND APPARATUS FOR CONDITIONING A POLISHING PAD USED IN CHEMICAL MECHANICAL PLANARIZATION", filed on Nov. 9, 1998, which is also incorporated herein by reference.

FIELD OF THE INVENTION

The present invention relates to an apparatus and method for conditioning a polishing pad. More particularly, the present invention relates to an apparatus and method for conditioning a polishing pad used in the chemical mechanical planarization of semiconductor wafers.

BACKGROUND

Semiconductor wafers are typically fabricated with multiple copies of a desired integrated circuit design that will later be separated and made into individual chips. A common technique for forming the circuitry on a semiconductor is photolithography. Part of the photolithography process requires that a special camera focus on the wafer to project an image of the circuit on the wafer. The ability of the camera to focus on the surface of the wafer is often adversely affected by unevenness in the wafer surface. This sensitivity is accentuated with the current drive toward smaller, more highly integrated circuit designs. Semiconductor devices are also commonly constructed in layers, where a portion of a circuit is created on a first level and conductive vias are made to connect up to the next level of the circuit. After each layer of the circuit is etched on a semiconductor wafer, an oxide layer is put down allowing the vias to pass through but covering the rest of the previous circuit level. Each layer of the circuit can create or add unevenness to the wafer that is preferably smoothed out before generating the next circuit layer.

Chemical mechanical planarization (CMP) techniques are used to planarize the raw wafer and each layer of material added thereafter. Available CMP systems, commonly called wafer polishers, often use a rotating wafer holder that brings the wafer into contact with a polishing pad moving in the plane of the wafer surface to be planarized.

In some CMP systems, a fixed-abrasive polishing pad is used to polish the wafer. The wafer holder then presses the wafer against the rotating fixed-abrasive polishing pad and is rotated to polish and planarize the wafer. CMP systems using a fixed-abrasive pad require the presence of features on the semiconductor wafer to function. Fixed-abrasive pads include abrasive particles embedded within a polymer matrix. To operate a CMP system having a fixed-abrasive pad, the fixed-abrasive pad must first be conditioned. Traditionally, fixed-abrasive pads are conditioned by polishing a patterned semiconductor wafer. The patterned semiconductor wafer conditions the fixed-abrasive pad by using the topography features created by the etching and deposition processes on the semiconductor wafer to remove a portion of the polymer matrix, thus exposing the abrasive particles embedded within. By exposing abrasive particles within the polymer matrix, the fixed-abrasive pad can begin to polish the semiconductor wafer.

In other CMP systems, a polishing fluid, such as a chemical polishing agent or slurry containing microabrasives, is applied to a wet-abrasive polishing pad to polish the wafer. The wafer holder then presses the wafer against the rotating wet-abrasive polishing pad and is rotated to polish and planarize the wafer. During the polishing process, the properties of the wet-abrasive polishing pad can change. Slurry particles and polishing byproducts accumulate on the surface of the pad. Polishing byproducts and morphology changes on the pad surface affect the properties of the polishing pad and cause the polishing pad to suffer from a reduction in both its polishing rate and performance uniformity. To maintain a consistent pad surface, provide microchannels for slurry transport, and remove debris or byproducts generated during the CMP process, wet-abrasive polishing pads are also typically conditioned. Pad conditioning restores the wet-abrasive polishing pad's properties by re-abrading or otherwise restoring the surface of the polishing pad. This conditioning process enables the pad to maintain a stable removal rate while polishing a substrate or planarizing a deposited layer and lessens the impact of pad degradation on the quality of the polished substrate.

As used herein, the term "polishing pad" will be used to describe not only fixed-abrasive polishing pads, but also wet-abrasive polishing pads as well.

Generally, polishing pads are either linear or radial in shape. A linear polishing pad is mounted on a linear belt that is wrapped around a series of rollers. A radial polishing pad is mounted on a circular disc that rotates about an axis.

One present method for conditioning a polishing pad uses a rotary disk embedded with diamond particles to roughen the surface of the polishing pad.

Typically, the disk is brought against the polishing pad and rotated about an axis perpendicular to the polishing pad while the polishing pad is rotated. The diamond coated disks produce predetermined microgrooves on the surface of the polishing pad. Because the linear velocities of the leading, center and lagging portions of the disk are different, the rate of microgrooving is different. This non-uniform microgrooving has led some pad conditioner manufacturers to add a continuous oscillation motion to the rotational movement of the rotary disk pad conditioners. This extra movement can result in part of the wafer being exposed to freshly conditioned portions of the polishing pad and another part of the wafer being exposed to a used portion of the polishing pad.

Another apparatus and method used for conditioning a polishing pad implements a rotatable bar on the end of an arm. The bar may have diamond grit embedded in it or high pressure nozzles disposed along its length. In operation, the arm swings the bar out over the rotating polishing pad and the bar is rotated about an axis perpendicular to the polishing pad in order to score the polishing pad, or spray pressurized water on the polishing pad, in a concentric pattern. These types of pad conditioners often do not provide uniform pad conditioning because they are only applied to a small portion of the width of the polishing pad's surface at any given time. Thus, the pressure of the conditioner against the polishing pad can vary.

Accordingly, further development of an apparatus and method for conditioning a polishing pad, and more specifically, for conditioning a polishing pad used in the chemical mechanical planarization of semiconductor wafers, is necessary in order to provide uniform pad conditioning.

SUMMARY

According to a first aspect of the present invention, an apparatus for conditioning a polishing pad used in chemical mechanical planarization of semiconductor wafers is provided. The polishing pad travels in a forward direction, and has a first point traveling at a first velocity and a second point traveling at a second velocity. The conditioning apparatus includes a non-rotatable conditioning member configured to engage the polishing pad. The conditioning member includes a primary edge opposed to a secondary edge. The first point defines a first path across the conditioning member from the primary edge to the secondary edge as the first point travels in the forward direction. The first path has a first length. The second point defines a second path across the conditioning member from the primary edge to the secondary edge as the second point travels in the forward direction. The second path has a second length. The second path does not intersect with the first path. Finally, the value of the first velocity multiplied by the first length is substantially equal to the value of the second velocity multiplied by the second length.

According to another aspect of the present invention, a method for conditioning a polishing pad used in chemical mechanical planarization of semiconductor wafers is provided. The method includes providing a non-rotatable conditioning member configured to engage the polishing pad. The conditioning member includes a primary edge opposed to a secondary edge, wherein the primary edge and the secondary edge are both in contact with the polishing pad, and wherein the primary edge is generally parallel to the secondary edge. The method also includes moving the polishing pad in a forward direction, and pressing the conditioning member against the polishing pad.

BRIEF DESCRIPTION OF THE DRAWINGS

FIG. 1 is a perspective view of a preferred embodiment of a polishing pad conditioner.

FIG. 2 is a side elevational view of the polishing pad conditioner of FIG. 1.

FIG. 11 is a flow diagram illustrating a preferred method of conditioning a polishing pad.

FIG. 12 is an alternative embodiment of a polishing pad conditioner.

Figure 3A:
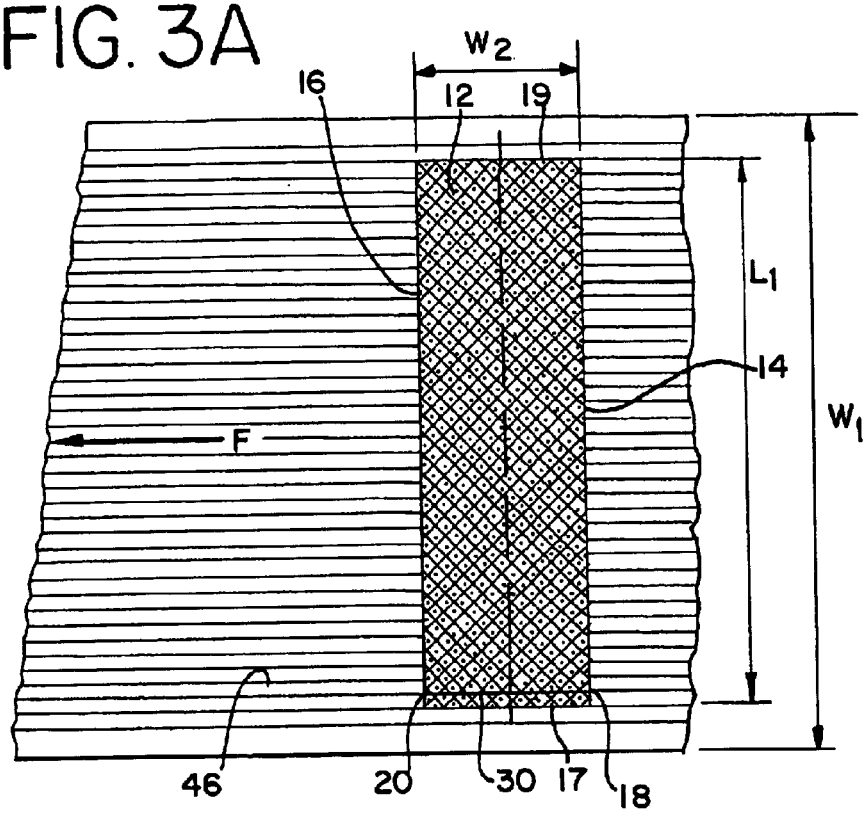
FIG. 3A illustrates a position of the polishing pad conditioner of FIG. 1 with respect to a polishing pad.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE PRESENTLY PREFERRED EMBODIMENTS

FIGS. 1 and 2 illustrate a presently preferred embodiment of a pad conditioner 10 for conditioning a polishing pad 46 used in chemical mechanical planarization of semiconductor wafers, according to the present invention. In one preferred embodiment, polishing pad 46 is a fixed-abrasive polishing pad, preferably for use in chemical mechanical planarization of semiconductor wafers. The fixed-abrasive polishing pad includes abrasive particles embedded within a polymer matrix. The abrasive particles include any particles that can be used to wear down or reduce a surface known by those skilled in the art, such as particles of sand, silica, alumina ($Al2O3$), zirconia, and diamond. The polymer matrix is used to hold the abrasive particles and may include different kinds of polymers that can be used to suspend or hold abrasive particles known to those skilled in the art. The polishing pad 46 may also be a wet-abrasive polishing pad, preferably for use in chemical mechanical planarization of semiconductor wafers. A chemical polishing agent or slurry containing microabrasives is applied to the wet-abrasive polishing pad to polish the semiconductor wafers. The wet-abrasive polishing pad is typically manufactured from any material that can be used as a carrier for the chemical polishing agent or slurry.

The pad conditioner 10 includes a non-rotatable conditioning member 12 configured to engage the polishing pad 46. As used herein, a non-rotatable conditioning member 12 is a conditioning member 12 that does not rotate with respect to the polishing pad 46, as best illustrated in FIGS. 1–7. Conditioning member 12 includes a contact surface 25 that faces polishing pad 46. In operation, the contact surface 25 is pressed against and comes into contact with polishing pad 46. Since conditioning member 12 does not rotate with respect to polishing pad 46, the same contact surface 25 is always in contact with polishing pad 46, as illustrated in FIGS. 1, 2, 6, and 7. However, conditioning member 12 may move with respect to the polishing pad 46 while maintaining that the same contact surface 25 is always in contact with polishing pad 46.

Figure 3B:
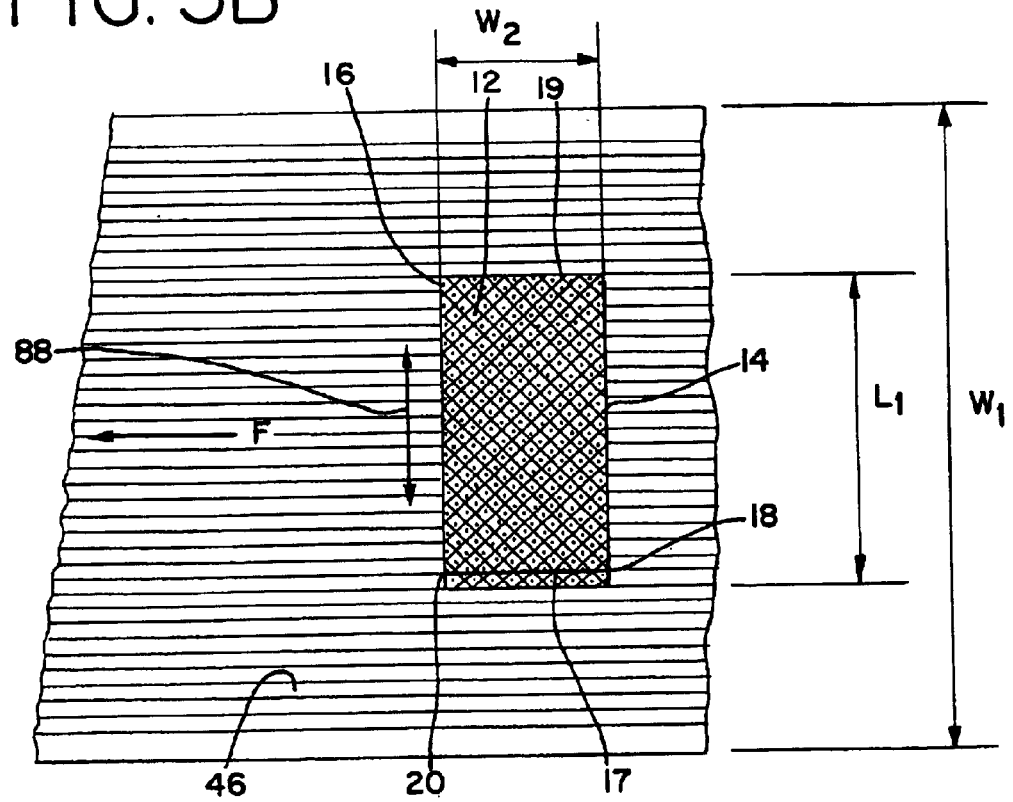
FIG. 3B illustrates a position of an alternative embodiment of a polishing pad conditioner with respect to a polishing pad.
Figure 4:
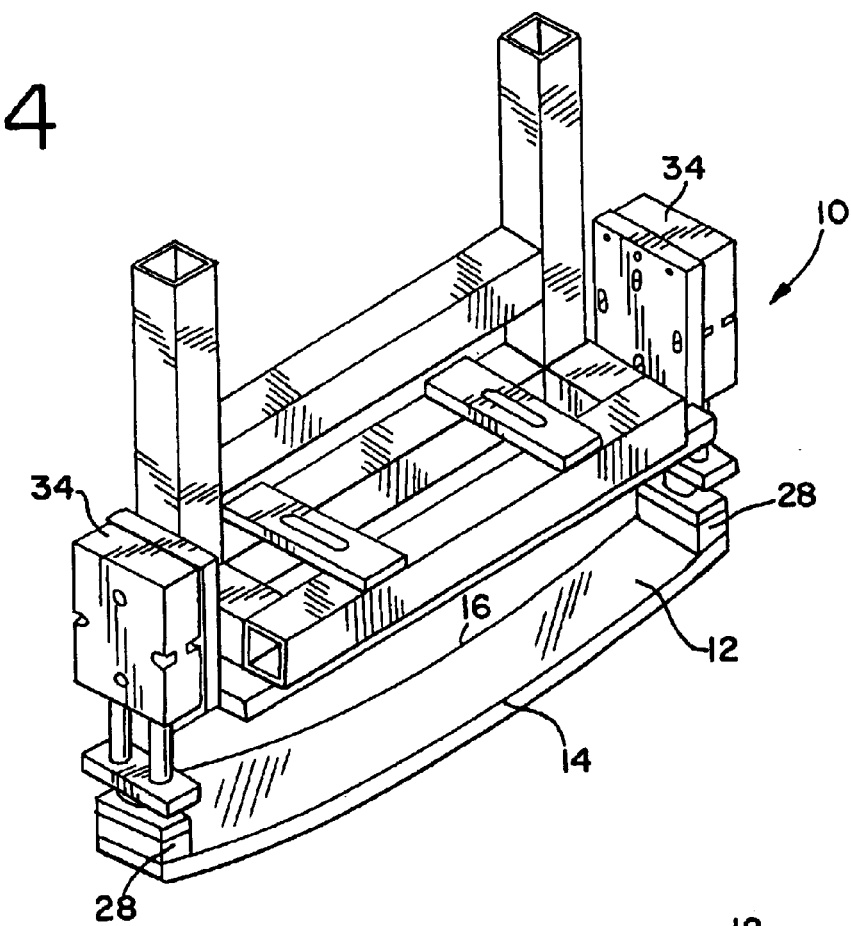
FIG. 4 is an alternative embodiment of a polishing pad conditioner.
Figure 5:
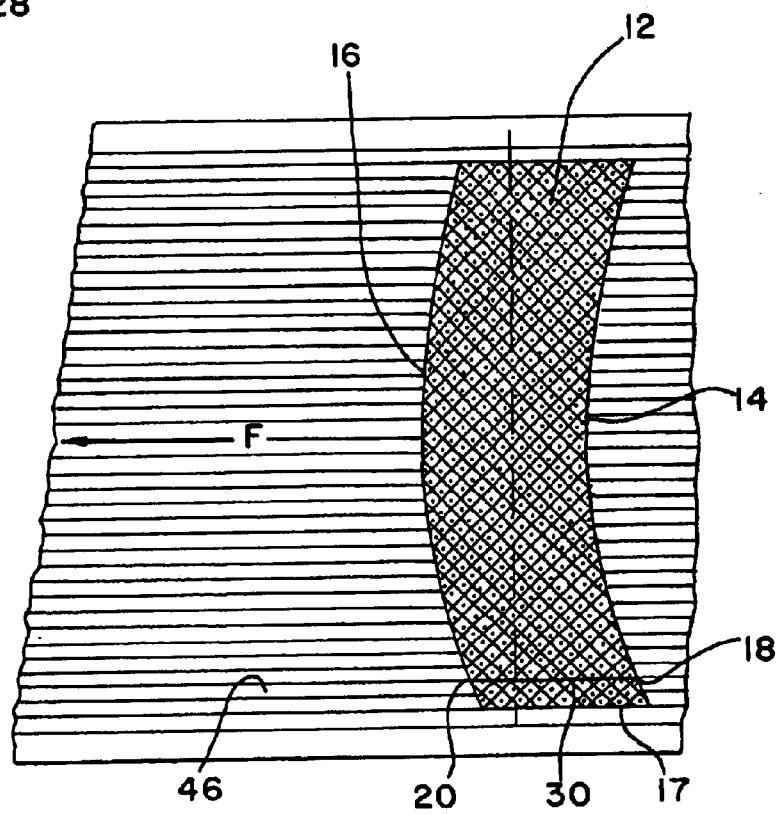
FIG. 5 illustrates a position of the polishing pad conditioner of FIG. 4 with respect to a polishing pad.

The conditioning member 12 includes a primary edge 14 opposed to a secondary edge 16, as illustrated in FIGS. 1–6. The primary edge 14 and the secondary edge 16 are both in contact with the polishing pad 46. Preferably, the primary edge 14 is generally parallel to the secondary edge 16. As used herein, the term "generally parallel" means that the distance between any primary point 18, that is a point that is on the primary edge 14, and any corresponding secondary point 20, that is a point that is on the secondary edge 16 along a directional line 30 that goes through the primary point 18 and is parallel to the forward direction F, does not vary more than 10% for any distance between any primary point 18 and any corresponding secondary point 20 along the primary edge 14 and the secondary edge 16, as illustrated in FIG. 3A. So, for example if the distance between a primary point 18 and a secondary point 20 is 10 cm, and the distance between all other primary points 18 on the primary edge 14 and all other secondary points 20 is between about 9 cm and 11 cm, then the primary edge 14 and the secondary edge 16 will be considered "generally parallel." In one embodiment, the primary edge 14 and the secondary edge 16 form straight lines, as illustrated in FIGS. 1, 2, 3A, and 3B. In another embodiment, the primary edge 14 and the secondary edge 16 form curved lines, as illustrated in FIGS. 4 and 5. Preferably, the curved lines are either concave or convex in order to provide increased stability for the conditioning member 12.

Figure 6:
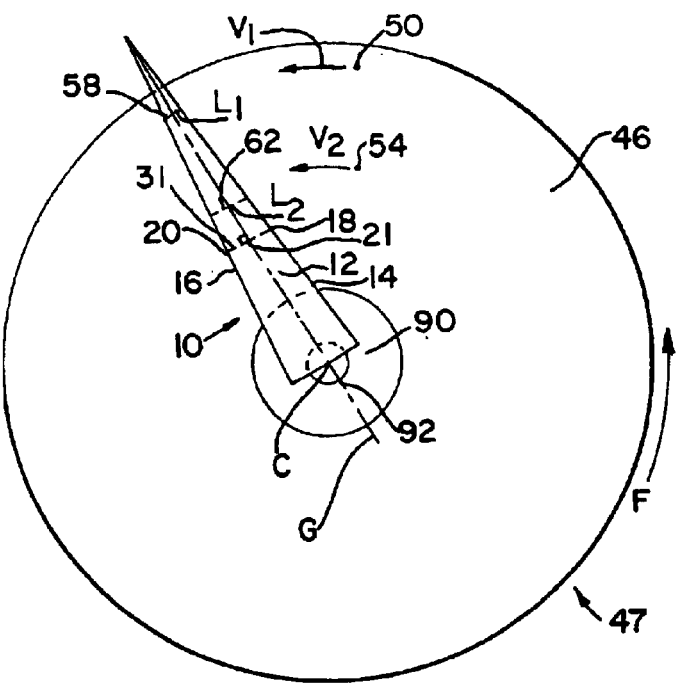
FIG. 6 is a top view of an alternative embodiment of the polishing pad conditioner used with a radial belt polisher.

Polishing pad 46 travels in a forward direction F, wherein the polishing pad 46 has a first point 50 traveling at a first velocity $V_1$, and a second point 54 traveling at a second velocity $V_2$, as illustrated in FIGS. 1 and 6. The first point 50 defines a first path 58 across the pad conditioning member 12 from the primary edge 14 to the secondary edge 16 as the first point 50 travels in the forward direction F, the first path 58 having a first length $L_1$, as illustrated in FIGS. 1 and 6. The second point 54 defines a second path 62 across the pad conditioning member 12 from the primary edge 14 to the secondary edge 16 as the second point 54 travels in the forward direction F, the second path 62 having a second length $L_2$. The second path 62 does not intersect with the first path 58, as illustrated in FIGS. 1 and 6. Preferably, the value of the first velocity $V_1$ multiplied by the value of the first length $L_1$ is substantially equal to the value of the second velocity $V_2$ multiplied by the value of the second length $L_2$. More preferably, the value of the first velocity $V_1$ multiplied by the value of the first length $L_1$ is between 50% and 150% of the value of the second velocity $V_2$ multiplied by the value of the second length $L_2$. In one embodiment, the value of the first velocity $V_1$ multiplied by the value of the first length $L_1$ is between 90% and 110% of the value of the second velocity $V_2$ multiplied by the value of the second length $L_2$. By insuring that $V_1 \cdot L_1$ is substantially equal to $V_2 \cdot L_2$, the pad conditioner 10 is able to provide uniform pad conditioning for the polishing pad 46. Polishing pad 46 may be mounted on a linear belt 48 and used in conjunction with a linear belt polisher 45, as described below. Polishing pad 46 may also be mounted on a radial belt 49 and used in conjunction with a radial belt polisher 47, as described below.

In one embodiment pad conditioner 10 includes an abrasive substance, such as a diamond grit 22, embedded in a strip 24 affixed along a contact surface 25 of the conditioning member 12. The contact surface 25 faces polishing pad 46, as illustrated in FIG. 1. The diamond grit 22 may have a density of 50 to 200 grit. Preferably, the diamond grit is dispersed randomly along the strip 24. The strip 24 may have any desired width $W_2$, as illustrated in FIGS. 2, 3A, and 3B. In another embodiment, conditioning member 12 may comprise any material known to those skilled in the art that may be used to condition a polishing pad 46, such as: collimated hole structures; and abrasive substances such as particles of sand, silica, alumina (Al2O3), zirconia, and diamond.

Figure 8:
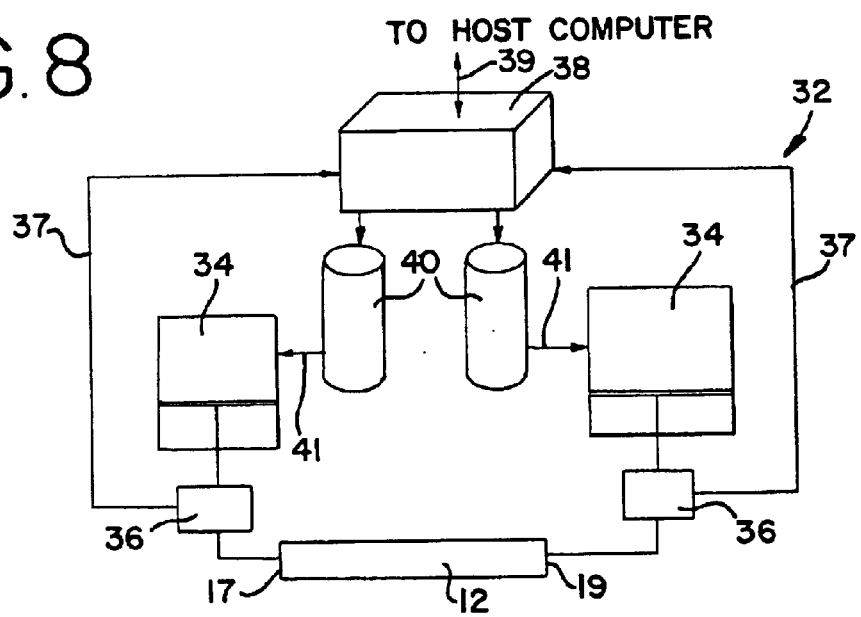
FIG. 8 is a schematic diagram of a preferred pressure control diagram of a pressure control system for use with the pad conditioner of FIG. 1.

The pad conditioner 10 also includes a pressure control system 32. As shown in FIG. 8, the pressure control system 32 includes pressure application devices 34, such as air cylinder and piston assemblies, attached to each end 17, 19 of the conditioning member 12 via load cells 36. Each load cell 36 is electrically connected to a central controller 38 over a feedback line 37 (FIG. 8). The central controller 38 determines the adjustments necessary to each end of the conditioning member 12 in order to maintain a desired pressure of the conditioning member 12 against the polishing pad 46 being conditioned. The controller 38 maintains the desired pressure on each end of the conditioning member 12 by controlling two proportional control valves 40, each connected to a respective one of the pressure application devices 34 via a control line 41. Each pressure application device 34 is therefore independently controllable by the central controller 38 to provide a uniform pressure across the polishing pad 46. The feedback loop created by the signals coming from the load cells 36 to the controller enables the pad conditioner 10 to maintain highly accurate pressure control at each end of the conditioning member 12. A command line 39 connects the central controller 38 to a host computer (not shown) that can adjust the operational parameters of the pad conditioner 10, such as pressure threshold and speed of rotational oscillation.

In one embodiment, the central controller 38 may be an embedded processor, such as a Zilog Z 180 or a Motorola HC11, running standard PID software. The pressure application devices may be hydraulic or pneumatic cylinder and piston assemblies. A lead screw or other actuator may also be used as the pressure application device 34. The load cells may be pressure transducers such as Sensotec Model 31/1429-04 available from Sensotec in Columbus, Ohio.

Figure 9:
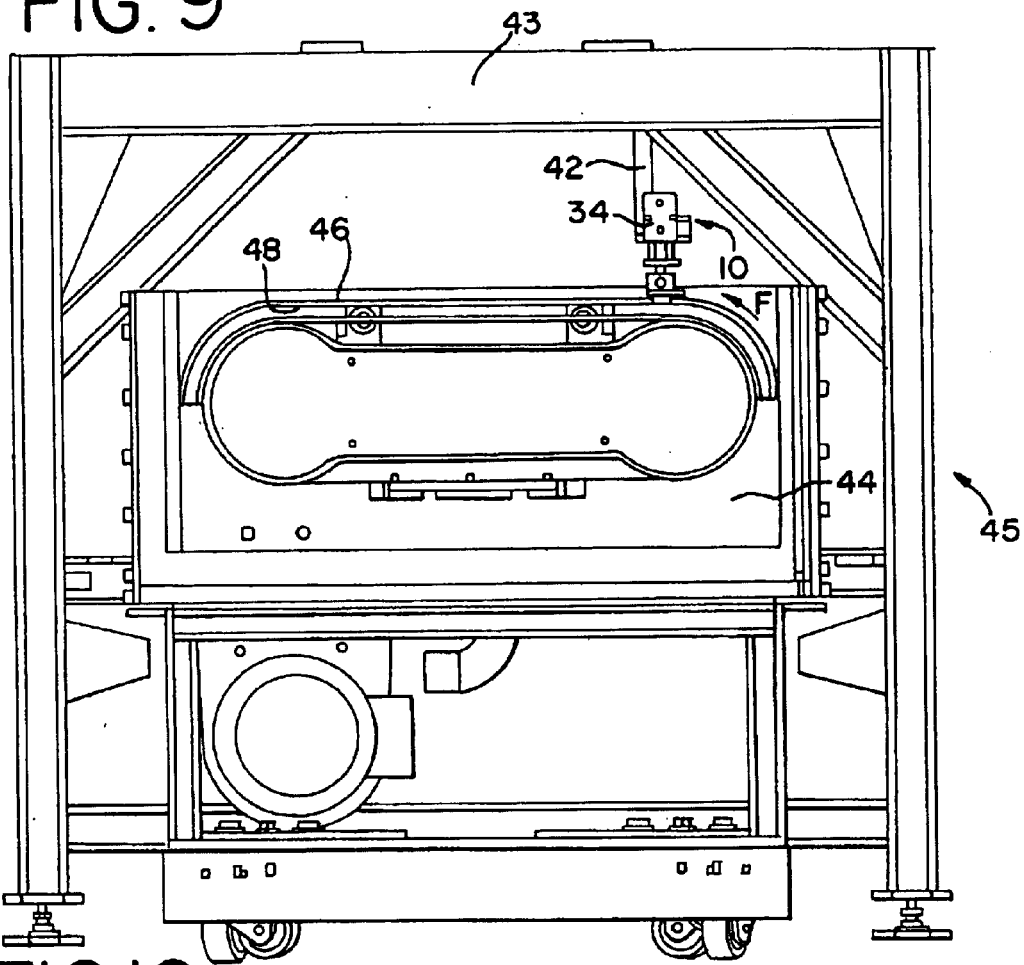
FIG. 9 is a side view of the pad conditioner of FIG. 1 used with a linear belt polisher.
Figure 10:
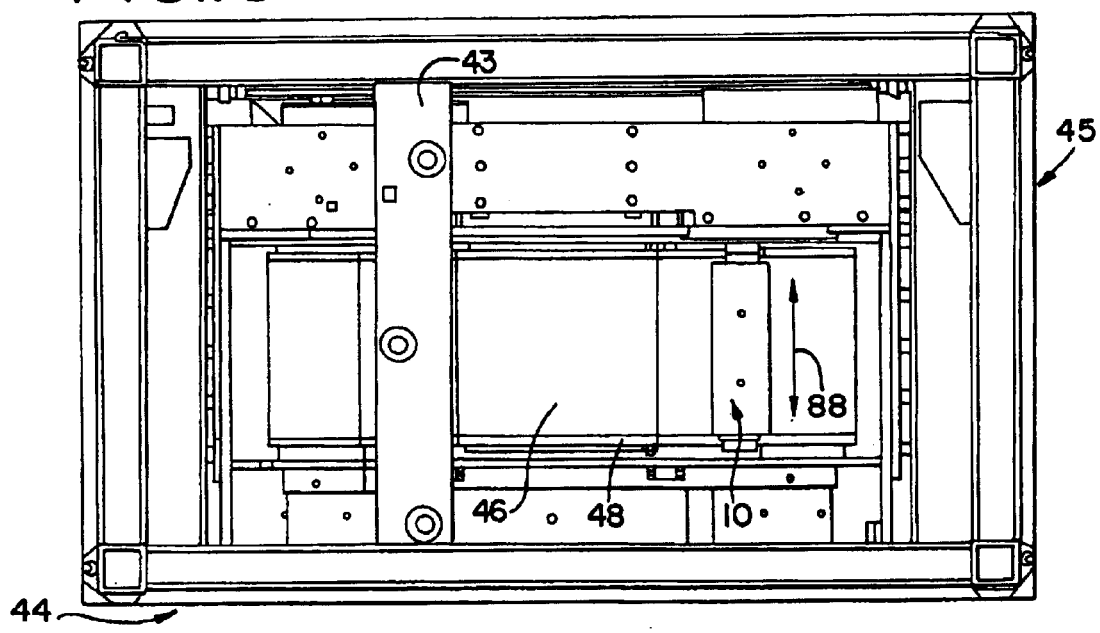
FIG. 10 is a top view of the polishing pad conditioner and linear belt polisher of FIG. 9.

FIG. 9 illustrates one environment in which a preferred embodiment of the pad conditioner 10 may operate. In FIG. 9, the pad conditioner 10 is positioned on a support member 42 attached to a frame 43 of a wafer polisher 44. The wafer polisher 44 may be a linear belt polisher 45 having a polishing pad 46 mounted on a linear belt 48 that travels in a forward direction F. The pressure application device 34, shown as a cylinder and piston assembly in this embodiment, acts both to provide the downforce for the conditioning member 12 against the polishing pad 46 and to extend and retract the conditioning member 12 from the polishing pad 46. In one embodiment, the pressure application device 34 may provide a downward pressure in the range of 0–10 p.s.i. The wafer polisher 44 may be a linear belt polisher 45 such as the TERES™ polisher available from Lam Research Corporation of Fremont, Calif. The alignment of the pad conditioner 10 with respect to the polishing pad 46 is best shown in FIGS. 9 and 10. Although the pad conditioner 10 may have a conditioning member 12 having a length $L_1$ that is less than the width $W_1$ of the polishing pad, in one preferred embodiment, the length $L_1$ of the conditioning member 12 is substantially equal to or greater than the width $W_1$ of the polishing pad 46 to allow for uniform conditioning across the entire width $W_1$ of the polishing pad 46, as illustrated in FIG. 3A. In one preferred embodiment, the length $L_1$ of the conditioning member 12 is substantially less than the width $W_1$ of the polishing pad 46. For example, in one embodiment the length $L_1$ of the conditioning member 12 is between 30 millimeters and 80 millimeters, and the width $W_1$ of the polishing pad 46 is between about 200 millimeters and 500 millimeters. In this embodiment, the conditioning member 12 is moved from one side of the polishing pad 46 to the other side of the polishing pad 46, as illustrated by the arrow 88 in FIG. 3B, to allow for uniform conditioning across the width $W_1$ of the polishing pad 46. The rate at which the conditioning member 12 is moved may be predetermined, or may be varied either manually or by a computer, to insure that there is uniform conditioning across the width $W_1$ of the polishing pad 46, as known by those skilled in the art. By moving the conditioning member 12 from one side of the polishing pad 46 to the other side of the polishing pad 46, the entire surface of polishing pad 46 can be uniformly conditioned.

Figure 7:
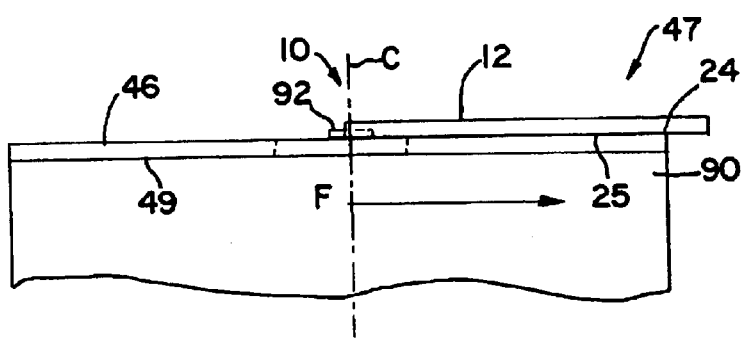
FIG. 7 is a side view of the polishing pad conditioner and radial belt polisher of FIG. 6.

In one preferred embodiment, wafer polisher 44 is a radial belt polisher 47 having a polishing pad 46 mounted on circular disc 90 that rotates in a forward direction F, as illustrated in FIGS. 6 and 7. Circular disc 90 rotates around shaft 92. The pad conditioner 10 is mounted along a radius of circular disc 90, wherein one end of the pad conditioner 10 is mounted to shaft 92. Preferably, the radial belt polisher 47 includes a radial belt 49 mounted onto the circular disc 90, as best illustrated in FIG. 7. The radial belt 49 may also be known as a rotary platform or rotary table. The polishing pad 46 is then mounted onto the radial belt 49 traveling in a forward direction F. The radial belt 49 defines a center C, located at the center of the radial belt 49, as illustrated in FIGS. 6 and 7. In this embodiment, the pad conditioner 10 includes a non-rotatable conditioning member 12 configured to engage the polishing pad 46. Preferably, the conditioning member 12 is mounted radially along the radial belt 49, that is, the centerline G of the conditioning member 12 goes through the center C of the radial belt 49, as illustrated in FIG. 6. The conditioning member 12 including a primary edge 14 opposed to a secondary edge 16, wherein the distance between the primary edge 14 and the secondary edge 16 decreases as the distance from the center C of the radial belt 49 increases. As defined herein the distance between the primary edge 14 and the secondary edge 16, is the distance between a primary point 18 on the primary edge 14 and a secondary point 20 on the secondary edge 16, wherein the primary and secondary points 18, 20 are located on a tangent line 31 that is tangent to the centerline G. Moreover, the distance from the center C of the radial belt 49 is defined herein as the distance from an intersection point 21 that is at the intersection of the tangent line and the centerline G, to the center C of the radial belt 49. In this embodiment, wafer polisher 44 may be a radial belt polisher 47 such as the Mirra polisher available from Applied Materials of Santa Clara, Calif. The alignment of the pad conditioner 10 with respect to the polishing pad 46 is best shown in FIG. 6.

Referring to FIG. 11, a preferred method of conditioning a polishing pad 46 utilizing the pad conditioner 10 described above is set forth below. The pad conditioner controller 38 receives a signal to begin conditioning the polishing pad 46 and instructs the conditioning member 12 to align the strip 24 toward the surface of the polishing pad 46 (at step 80). The controller 38 controls the proportional control valves 40 to activate the pressure application devices 34 connected to the ends 17, 19 of the conditioning member 12 and lower the conditioning member 12 against the polishing pad 46 (at step 82). The polishing pad 46 is preferably already moving when the conditioning member 12 contacts the polishing pad 46. In one embodiment, the polishing pad 46 is moving linearly on a linear belt 48. In other embodiments, the polishing pad 46 may be moving in a circular direction on a rotating circular disc 90.

Upon lowering the conditioning member 12, the conditioning member 12 is pressed against the polishing pad 46, and the conditioning of the polishing pad 46 is begun (at step 84). In another preferred embodiment, the pad conditioning process may also include the step of moving the polishing pad 46 from side to side as illustrated by the arrow 88 in FIG. 10.

The pad conditioner 10 maintains a constant pressure between the conditioning member 12 and the polishing pad 46 (at step 86). The load cells 36 at each end of the conditioning member 12 each generate a signal proportional to the pressure applied by the air cylinder and piston of the pressure application device 34. The load cells 36 send their separate signals to the controller 38 which can individually adjust the pressure applied at the two ends 17, 19 of the conditioning member 12. The continuous feedback of sensed pressure, coupled with individual control for each end 17, 19 of the conditioning member 12 permit a substantially even pressure against the pad. Irregularities and variations are sensed and compensated for by the controller through the feedback system. After the polishing pad 46 and the conditioning member 12 have been in contact for a desired amount of time, the pressure application devices 34 retract the conditioning member 12.

Figure 14:
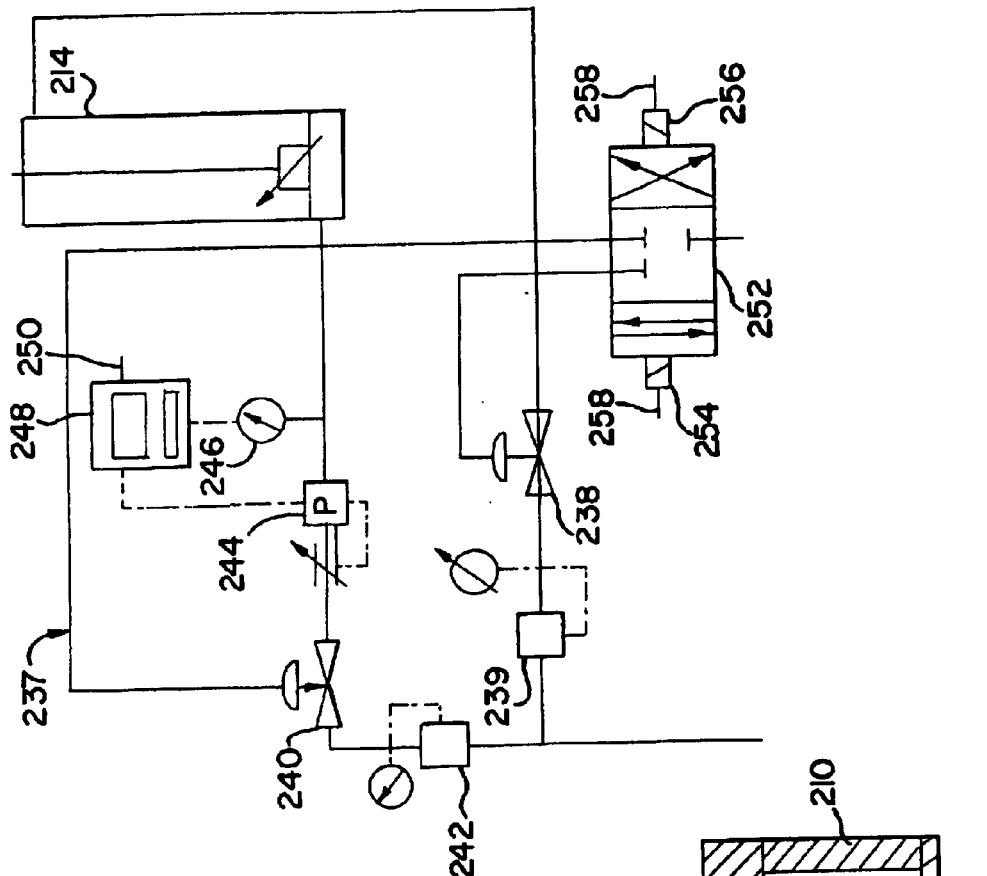
FIG. 14 is a schematic diagram of a downforce control system for the polishing pad conditioner of FIG. 12.
Figure 13:
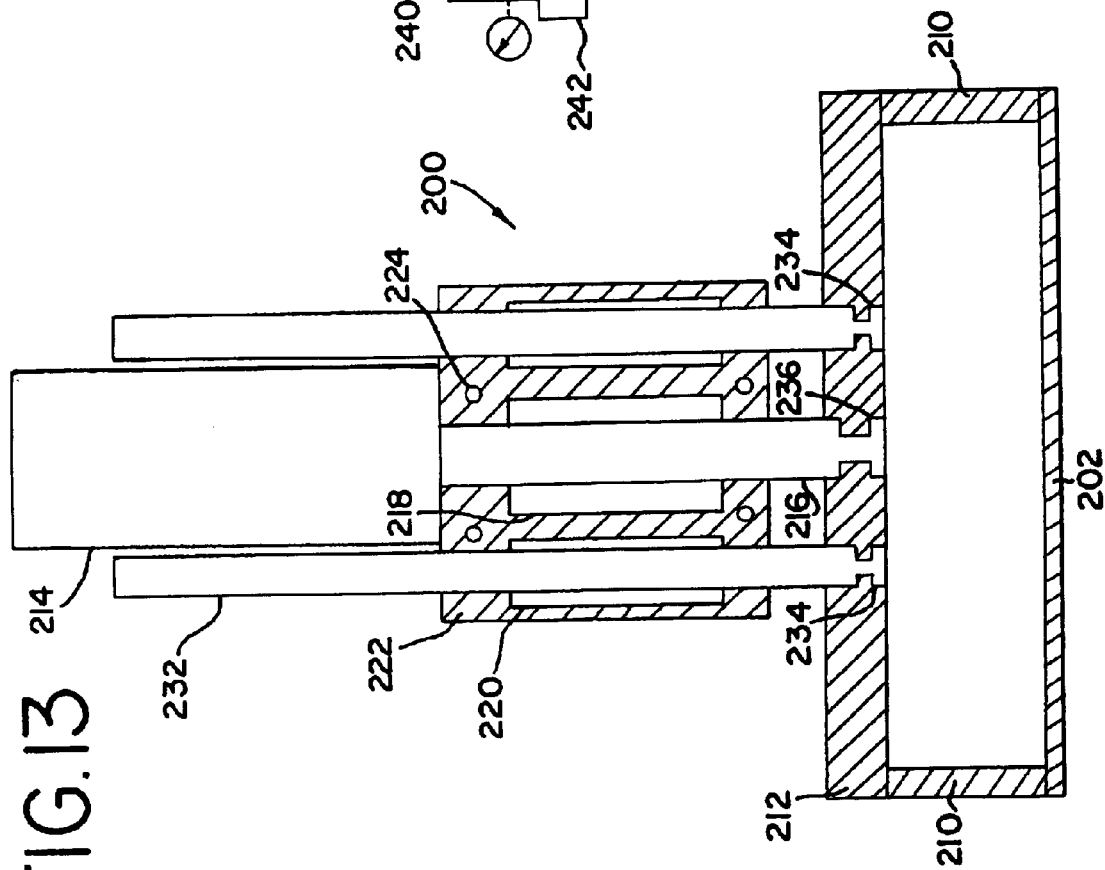
FIG. 13 is a sectional view of the polishing pad conditioner of FIG. 12.

Another embodiment of the polishing pad conditioner 200 is shown in FIGS. 12–14. In this embodiment, the pad conditioner 200 has a conditioning member 202 consisting of a precision ground stainless steel plate, plated with an abrasive substance that is rigidly coupled on each end to a support member 210. The abrasive substance can be any abrasive substance that can be used to wear down or reduce a surface known by those skilled in the art, such as sand, silica, alumina ($Al_2O_3$), zirconia, and diamond. In one preferred embodiment, the abrasive substance comprises diamonds. Preferably, diamonds corresponding to 100 grit (163 microns) size are deposited and plated over a contact surface 225 of the conditioning member 202 such that the contact surface 225 of the conditioning member 12 is uniformly covered with sharp diamond pyramids oriented normal to the contact surface 225 of the conditioning member 202. The support members 210 may be made from 440C stainless steel, hardened to a Rockwell hardness of 50 to 55 and machined to close tolerances so that resulting tolerances are less than 0.0001 inch. The support members 210 mount securely to a plate 212 and support the resulting assembly.

FIG. 13 shows the cross-sectional view of the pad conditioner 200. The support members 210, plate 212 and attached conditioning member 202 are preferably movable by a commercially available double acting cylinder 214 with cushioned pads on both sides. One suitable double acting cylinder with cushioned pads is the AV 1×2"-B available from PHD, Inc. of Fort Wayne, Ind. The shaft 216 of the cylinder 214 is guided by a linear bearing 218 to achieve smooth system operation and limit friction. A mounting block 222 serves as an attachment block for cylinder 212. The mounting block 222 securely bolts to an alignment plate 226 with four bolts 224. In addition to containing the linear bearing 218 for the cylinder shaft 216, the mounting block 222 contains linear bearings 220 that slidably guide two guide shafts 232 positioned on either side of the cylinder shaft 216. During operation, the cylinder 214 is subject to various loads, such as normal, side and torsion loads. In order to compensate for this loading, the two guide shafts 232 are securely attached to the plate 212 with Allen-head screws 234. Each guide shaft 232 is mounted on linear guide bearings 220 and is free to slide in a direction parallel to the cylinder shaft 216 via. The shaft 216 of the double acting cylinder 214 is also securely attached to the plate 210 with an Allen-head screw 236 in order to increase the system's mechanical stability and resistance to side loads. Suitable guide shafts 232 may be 0.500 inch diameter precision-ground and hardened metal shafts.

To counterbalance the weight of the system, two compensating springs 228 are added to the assembly. Preferably, the springs are mounted coaxially around each of the guide shafts 232 between a slide bushing 230 and the mounting block 222. Required counterbalance force is adjusted by moving the two sliding bushings 230 to compress the spring 228 the desired amount. The alignment plate 226 allows alignment of the conditioning member 202 to the surface of the belt pad and attaches the pad conditioner assembly 200 to the frame of the wafer polisher 44 (FIGS. 9–10).

Precise downforce control on the roller is achieved by using a continuous automated downforce controller 237 as shown in FIG. 14. In the idle state of operation a first valve 238 is turned ON and a second valve 240 is turned OFF. This action provides a necessary retracting force to cylinder 212. Pressure that is available to the supply side of the first valve 238 is regulated by a first pressure regulator 239 in the range of 1 to 10 pounds per square inch (p.s.i.). During operation, the second valve 240 is ON and the first valve 238 is OFF. Pressure that is available to the supply side of the second valve 240 is regulated by a second pressure regulator 242 in the range of 5 to 20 p.s.i. Pressure at the second valve 240 is continuously controlled by an electro-pneumatic regulator 244 and monitored by a pressure sensor 246. Both the electro-pneumatic regulator 244 and pressure sensor 246 are in closed loop control mode via a controller 248. The regulator 244 may be a Pressure Control Valve ITV 2000 available from SMC Corp. of Tokyo, Japan. The pressure sensor 246 may be a ThruTube transducer and the controller may be a Multi-Channel Digital Controller Model LR3400 both available from Span Instruments, Inc. of Plano, Tex.

The controller 248 continuously exchanges downforce information such as set point values, pressure on/off commands, data on the difference between requested downforce and actual downforce, etc. with a process module controller (not shown) via a RS 232 link 250. Both valves 238, 240 are controlled by a pneumatic signal supplied by a 4-way/3 position solenoid controlled valve 252. Solenoids 254 and 256 get ON/OFF commands from the process module controller over digital I/O lines 258. In this manner, the system 200 achieves quick downforce response and feedback with a minimum of components. In one preferred embodiment, the process module controller may be a Pentium® based PC configured to allow direct analog/digital interface with controllers, motors, valves, and the like and is in communication with a wafer polishing system controller. The wafer polishing system controller may be an embedded PC such as the Pentium MMX® PCA-6153 Single Board Computer, commercially available from Advantech Technologies, Inc. of Santa Clara, Calif., used in the TERES™ wafer polisher available from Lam Research Corporation in Fremont, Calif.

In a wafer polishing system using the pad conditioner 200 of FIGS. 12–14, a semiconductor wafer to be polished is brought under pressure on to the polishing pad 46. In a preferred embodiment, the wafer polisher 44 is a linear belt polisher 45, such as the TERES™ polisher available from Lam Research Corporation, with a polishing pad 46 mounted on the linear belt 48. The linear belt 48 is preferably capable of moving with linear velocities ranging from 50 to 1000 linear feet per minute. During polishing, the polishing pad conditioner 200 is lowered against the polishing pad 46 by the cylinder and shaft 214, 216. The downforce controller 237 controls the cylinder 214 so that a constant pressure is continuously applied to hold the conditioning member 202 against the polishing pad 46. Although the cylinder 214 may operate to apply pressures of 0.1 to 100 p.s.i. to the surface of the polishing pad 46, the cylinder 214 preferably operates to produce a constant pressure in the range of 1 to 6 p.s.i. during conditioning, and most preferably is operated to maintain a pressure of 1 p.s.i. at the surface of the polishing pad 46. The pad conditioner 200 may be adjusted to continuously contact and condition the polishing pad 46, to contact the polishing pad 46 only after a semiconductor wafer is polished on the wafer polisher 44, or to intermittently polish the polishing pad 46 during a wafer polishing process.

A plurality of discrete contacts between the diamond points embedded on the contact surface 225 of the conditioning member 202 form an area of contact with the surface of the polishing pad 46 and generate a multitude of micro-cuts in the polishing pad 46 as the conditioning member 202 held against the polishing pad 46 attached to the linear belt 48. In this manner, the polishing pad 46 is conditioned by the action of the diamond grit removing a fine layer of material from the polishing pad 46 and exposing micro-pores on the top surface of the polishing pad 46. The pores are cut by the passive action of the conditioning member 202 as the downforce controller 237 maintains the pressure of the conditioning member 202 against the polishing pad 46.

Another aspect of the present invention includes a method of conditioning a polishing pad. The method includes providing a non-rotatable pad conditioning member 12 configured to engage the polishing pad 46. The conditioning member 12 includes a primary edge 14 opposed to a secondary edge 16, wherein the primary edge 14 and the secondary edge 16 are both in contact with the polishing pad 46. The primary edge 14 is generally parallel to the secondary edge 16. The method further includes moving the polishing pad 46 in a forward direction and pressing the conditioning member 12 against the polishing pad 46. A pressure is maintained against the polishing pad 46 with the conditioning member 12. According to this method, marks are produced on the polishing pad 46.

Thus, there has been disclosed in accordance with the invention, an apparatus and method for conditioning a chemical mechanical planarization process that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications that fall within the scope of the appended claims and equivalents thereof.

What is claimed is:

1. An apparatus for conditioning a polishing pad used in chemical mechanical planarization of semiconductor wafers, the polishing pad travels in a forward direction, wherein the polishing pad has a first point traveling at a first velocity and a second point traveling at a second velocity, the apparatus comprising:

a non-rotatable conditioning member configured to engage a surface of the polishing pad and forming at least one microchannel in the surface, the microchannel enabling slurry transport and removal of debris or byproducts generated during a chemical mechanical planarization process, wherein the conditioning member includes a primary edge opposed to a secondary edge, wherein the first point defines a first path across the conditioning member from the primary edge to the secondary edge as the first point travels in the forward direction, the first path having a first length, wherein the second point defines a second path across the conditioning member from the primary edge to the secondary edge as the second point travels in the forward direction, the second path having a second length, wherein the second path does not intersect with the first path, and wherein the value of the first velocity multiplied by the first length is substantially equal to the value of the second velocity multiplied by the second length.

2. The apparatus of claim 1, wherein the conditioning member comprises a contact surface configured to engage the polishing pad between the primary edge and the secondary edge.

3. The apparatus of claim 1, wherein the primary edge and the secondary edge form straight lines.

4. The apparatus of claim 1, wherein the primary edge and the secondary edge form curved lines.

5. The apparatus of claim 4, wherein the curved lines are concave.

6. The apparatus of claim 4, wherein the curved lines are convex.

7. The apparatus of claim 1, wherein the polishing pad comprises a fixed-abrasive polishing pad.

8. The apparatus of claim 1, wherein the conditioning member is mounted above the polishing pad.

9. An apparatus for conditioning a polishing pad used in chemical mechanical planarization of semiconductor wafers, the polishing pad mounted onto a linear belt traveling in a forward direction, the apparatus comprising:
   a non-rotatable conditioning member disposed proximate to the polishing pad and comprising a primary edge and a spaced-apart secondary edge, the conditioning member configured to engage a surface of the polishing pad and forming at least one microchannel in the surface, the microchannel enabling slurry transport and removal of debris or byproducts generated during a chemical mechanical planarization process,
   wherein the primary edge and the secondary edge are both in contact with the polishing pad, and wherein the primary edge is generally parallel to the secondary edge.

10. The apparatus of claim 9, wherein the conditioning member comprises a contact surface configured to engage the polishing pad between the primary edge and the secondary edge.

11. The apparatus of claim 9, wherein the primary edge and the secondary edge form straight lines.

12. The apparatus of claim 9, wherein the primary edge and the secondary edge form curved lines.

13. The apparatus of claim 8, wherein the polishing pad has a width, and wherein the conditioning member has a width that equal to or greater than the width of the polishing pad.

14. The apparatus of claim 9, wherein the polishing pad comprises a wet-abrasive polishing pad.

15. The apparatus of claim 9, wherein the polishing pad comprises a fixed-abrasive polishing pad.

16. The apparatus of claim 9, wherein the conditioning member is mounted above the polishing pad.

17. An apparatus for conditioning a polishing pad used in chemical mechanical planarization of semiconductor wafers, the polishing pad having a center around which the polishing pad rotates, the apparatus comprising:
   a non-rotatable conditioning member disposed proximate the polishing pad and comprising a primary edge and a spaced-apart secondary edge, the conditioning member further configured to engage a surface of the polishing pad and forming at least one microchannel in the surface enabling slurry transport and removal of debris or byproducts generated during a chemical mechanical planarization process.

18. The apparatus of claim 17, wherein the conditioning member comprises a contact surface configured to engage the polishing pad between the primary edge and the secondary edge.

19. The apparatus of claim 17, wherein the primary edge and the secondary edge form straight lines.

20. The apparatus of claim 17, wherein the primary edge and the secondary edge form curved lines.

21. The apparatus of claim 17, wherein the polishing pad has a radius and wherein the conditioning member has a length that equal to or greater than the radius of the polishing pad.

22. The apparatus of claim 17, wherein the conditioning member is mounted along an axis passing through the center of the polishing pad.

23. The apparatus of claim 22, wherein a distance between the primary edge and the secondary edge decreases as a distance from the center of the polishing pad increases.

24. The apparatus of claim 17, wherein a distance between the primary edge and the secondary edge changes with increasing distance from the center of the polishing pad.

25. The apparatus of claim 24, wherein the distance between the primary edge and the secondary edge decreases with increasing distance from the center of the polishing pad.

26. A method for conditioning a polishing pad used in chemical mechanical planarization of semiconductor wafers, the method comprising:
   providing a non-rotatable conditioning member configured to engage a surface of the polishing pad to be conditioned, the conditioning member including a primary edge opposed to a secondary edge, wherein the primary edge and the secondary edge are both in contact with the polishing pad, and wherein the primary edge is generally parallel to the secondary edge;
   moving the polishing pad in a forward direction; and
   pressing the conditioning member against the polishing pad to enable slurry transport and removal of debris or byproducts generated during a chemical mechanical planarization process.

* * * * *